(12) United States Patent
Chudzik et al.

(10) Patent No.: US 7,030,481 B2
(45) Date of Patent: Apr. 18, 2006

(54) HIGH DENSITY CHIP CARRIER WITH INTEGRATED PASSIVE DEVICES

(75) Inventors: Michael Patrick Chudzik, Beacon, NY (US); Robert H. Dennard, New Rochelle, NY (US); Rama Divakaruni, Ossining, NY (US); Bruce Kenneth Furman, Poughquag, NY (US); Rajarao Jammy, Hopewell Junction, NY (US); Chandrasekhar Narayan, Hopewell Junction, NY (US); Sampath Purushothaman, Yorktown Heights, NY (US); Joseph F. Shepard, Jr., Fishkill, NY (US); Anna Wanda Topol, Wappingers Falls, NY (US)

(73) Assignee: Internation Business Machines Corporation, Armonk, NY (US)

( * ) Notice: Subject to any disclaimer, the term of this patent is extended or adjusted under 35 U.S.C. 154(b) by 77 days.

(21) Appl. No.: 10/314,589

(22) Filed: Dec. 9, 2002

(65) Prior Publication Data
US 2004/0108587 A1    Jun. 10, 2004

(51) Int. Cl.
*H01L 23/053* (2006.01)

(52) U.S. Cl. .................................................. 257/700

(58) Field of Classification Search ................. 257/700
See application file for complete search history.

(56) References Cited

U.S. PATENT DOCUMENTS

| | | | | |
|---|---|---|---|---|
| 5,811,868 | A | | 9/1998 | Bertin et al. ................. 257/516 |
| 6,221,769 | B1 | | 4/2001 | Dhong et al. ................ 438/667 |
| 6,418,029 | B1 | * | 7/2002 | McKee et al. ............... 361/760 |
| 6,502,231 | B1 | * | 12/2002 | Pang et al. .................... 716/17 |
| 6,638,077 | B1 | * | 10/2003 | Fan et al. ...................... 439/66 |
| 6,642,080 | B1 | * | 11/2003 | Ference et al. ............. 438/109 |
| 6,645,851 | B1 | * | 11/2003 | Ho et al. ..................... 438/626 |
| 6,653,676 | B1 | * | 11/2003 | Tsu et al. .................... 257/296 |
| 6,665,194 | B1 | * | 12/2003 | Patel et al. .................. 361/767 |
| 6,669,489 | B1 | * | 12/2003 | Dozier et al. ................. 439/71 |
| 6,723,600 | B1 | * | 4/2004 | Wong et al. ................. 438/244 |
| 6,781,219 | B1 | * | 8/2004 | Bissey ......................... 257/666 |

FOREIGN PATENT DOCUMENTS

EP          0 268 260        * 11/1987

OTHER PUBLICATIONS

Stanley Wolf Silicon Processing for the VLSI Era vol. 2 lattice press 1990 p. 56.*

* cited by examiner

*Primary Examiner*—David S. Blum
(74) *Attorney, Agent, or Firm*—Daniel P. Morris, Esq.; Perman & Green, LLP

(57) ABSTRACT

A carrier for a semiconductor component is provided having passive components integrated in its substrate. The passive components include decoupling components, such as capacitors and resistors. A set of connections is integrated to provide a close electrical proximity to the supported components.

52 Claims, 14 Drawing Sheets

HIGH DENSITY CHIP CARRIER WITH INTEGRATED PASSIVE DEVICES

BACKGROUND OF THE INVENTION

1. Field of the Invention

The present invention relates to the integration of passive elements into a silicon carrier structure for connecting integrated circuits, components, and other semiconductor components.

2. Brief Description of Related Developments

In advanced electronic computing systems the decoupling capacitors serve as a charge reservoir to support instantaneous current surges that invariably accompany simultaneous circuit switching. They are employed on chip and across all levels of packaging, including single chip and multi chip modules, board and back plane. In addition these passive components are required in the power distribution systems for integrated circuits (IC) to reduce the simultaneous circuit switching noise, or ΔI (Delta I) noise. However, the ability to support an adequate decoupling capacitance at high frequencies is of increasing concern in both on-chip and off-chip systems. The relentless scaling to ever smaller device dimensions and faster circuit speed at the chip level have driven the demand for higher packaging density, but they also drive a need for new solutions to the increasing decoupling dilemma.

In particular, the decoupling capacitors have to not only possess sufficient capacitance, but also must be accessible in time scales comparable to the ever shorter clock cycle times, resulting from increasing circuit speeds. The increase in power efficiency required in microprocessor units, especially for portable computing and communication needs, has further exacerbated the problem. A proposed solution is clock gating (the ability to turn off clock circuits in unused parts of the chip); however, this increases the number of switching events dramatically and brings new complications because of greatly increased I noise. In order to achieve a desired damping of the voltage fluctuations associated with the ΔI noise, damping resistive elements also may need to be incorporated along with the decoupling capacitive elements. Hence, new solutions that address all of these issues and allow for more effective integration of various capacitive and resistive components in close proximity to the processor circuitry are needed. In one solution, decoupling capacitance is incorporated into the substrate of a chip, as described in commonly owned U.S. Pat. No. 5,811,868.

Currently used passive decoupling elements are generally based on thin or thick film ceramic technology, thin film on silicon, or several small discrete surface mounted devices built into one large package. In the case of electronic package applications, currently used discrete capacitors do not have sufficiently low enough parasitic inductance to be used in the high frequency or high speed circuits being proposed for the near future. The ability to bury passive devices (integrated passives [IPs]) within printed wiring board or modules opens up space for mounting other components that now can be placed where previously discrete passive components were located. The thin film-based IP devices exhibit better high frequency performance and provide easier component integration schemes. These components must be fabricated using technology compatible with carrier materials and fabrication processes. In addition, to meet future high performance needs, the decoupling elements must be electrically accessible within a time frame comparable to the clock cycle times of device chips.

Building these elements on the processor chip would provide an acceptable access time but this would take up chip real estate away from active circuits that need to be built on these high performance chips. It is therefore clear that a better solution is needed to provide decoupling capacitors and resistors with appropriate properties, and to place them where they are accessible to the device circuitry on the chips within a time close to the chip clock cycle.

SUMMARY OF THE INVENTION

The present invention pertains to the design, fabrication, and the resulting structures that enable integration of passive circuit elements, such as capacitors and resistors, within a close proximity of the relevant circuit elements on a chip. More specifically it overcomes the difficulties associated with the slower access times of discrete passives mounted on the microelectronic chip packages. The invention provides a low inductance and low resistance integration of active circuit elements with passive elements. In particular, it is an object of this invention to provide a structure for an integrated carrier which includes passive elements for high frequency and high speed computing applications. It is further an object of this invention to combine capacitors and/or resistors to form a complete high density interconnect structure with integrated passive devices within a silicon-based chip carrier. It is further an object of this invention to enable fast electrical access between the circuits on the chip and the passives on the carrier by virtue of low inductance input/output means such as area array solder bumps.

These objects and the associated preferred embodiments are described in detail below along with illustrative figures listed herein.

BRIEF DESCRIPTION OF THE DRAWINGS

The carrier substrate of this invention is explained in more detail below with reference to the accompanying drawing, in which.

DESCRIPTION OF THE PREFERRED EMBODIMENT

High speed microelectronic chips forming parts of a high performance computing system contain a very large number of transistors and as such require a very high number of input/output (I/O) connections and a high density of interconnecting wires to enable chip to chip communication. While multilayer ceramic substrates and printed wiring boards can provide this connectivity for low to moderate performance chips, a silicon based carrier has been recently proposed which allows a very high chip-to-chip wiring density (<5 µm pitch) with ability to interconnect chips of different technologies using micro joint input/output contacts. Micro joint contacts are described in commonly owned pending applications for patent, filed under IBM docket numbers YOR9-2001-0216-US1, YOR92001-0217-US1, and YOR92001-0249, each filed on January 18, the disclosures of which are incorporated herein by reference. It is an intent of the present invention to use the Si-carrier in addition as a support for passive elements. Such a solution allows decoupling capacitors to be integrated electrically closer to the chip, when compared to the remote discrete capacitive elements on the package, and at the same time keeps them off the chip leaving the chip's real estate free for active circuits.

Figure 1:
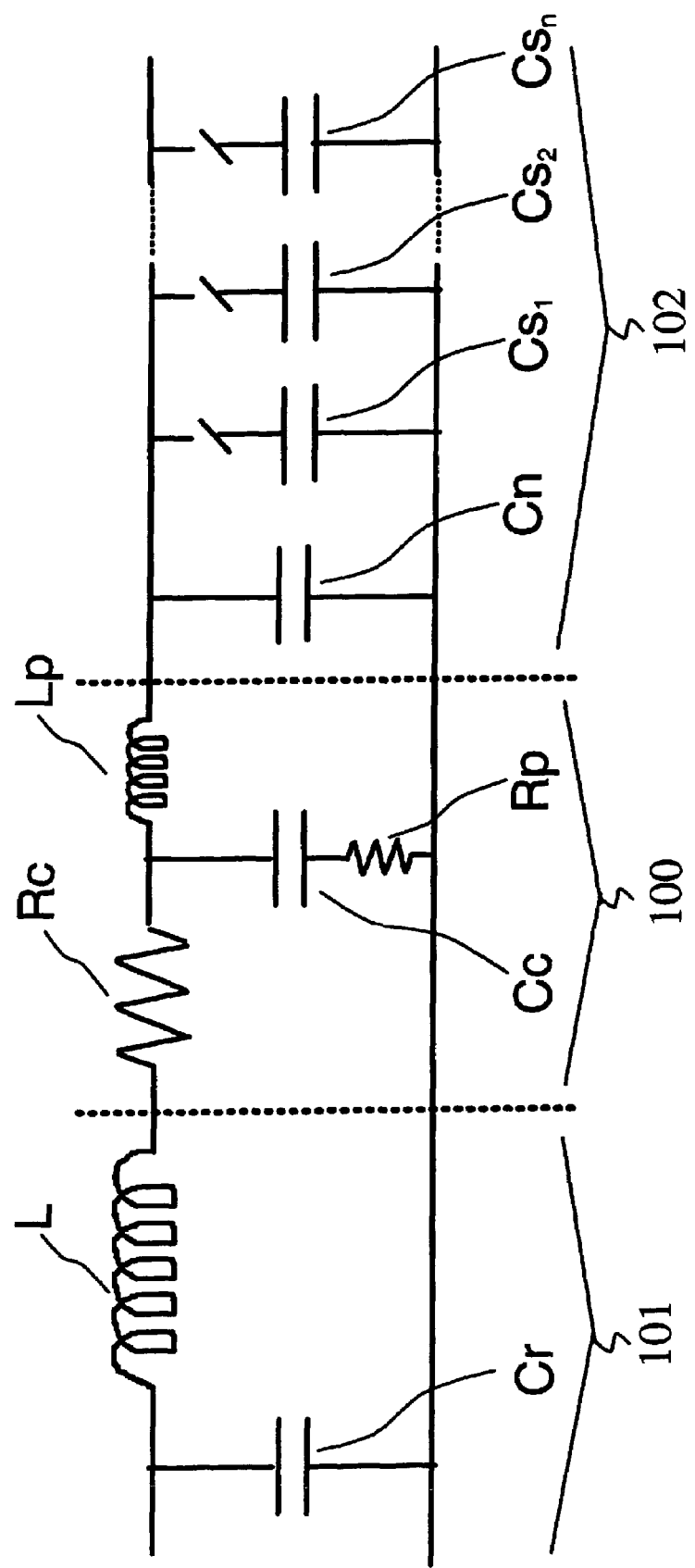
FIG. 1. An equivalent electrical circuit of an enhanced chip carrier that incorporates resistive and capacitive decoupling components.

An equivalent electrical circuit of an enhanced chip carrier that incorporates resistive and capacitive decoupling elements, is shown in FIG. 1. The portion of the circuit bounded by the two vertical dotted lines represents the area of the silicon carrier 100. The elements of the silicon carrier include the parasitic resistance Rp and inductance Lp associated with geometry and physical characteristic of the structural elements (interconnect wiring, through vias, and I/O pads) and carrier passive elements (capacitive components Cc and resistive components Rc) introduced by the present inventive method. In FIG. 1 the area in the far left of the figure represents the package 101 with its remote decoupling capacitance Cr and its intrinsic inductance L. To the right of the Si-carrier area, the chip 102 is represented by total non-switching capacitance Cn (such as on chip decoupling and SRAM components) and switching capacitance. Since clock gating and resonance effects (lasting over many cycles) have to be taken into consideration the total switching capacitance at a given cycle may vary. Therefore the $Cs_1$, $Cs_2$, ... $Cs_n$ represent the varying switching capacitance of various circuit elements (related for example to the activation of certain clock buffers and their corresponding latches).

Figure 2:
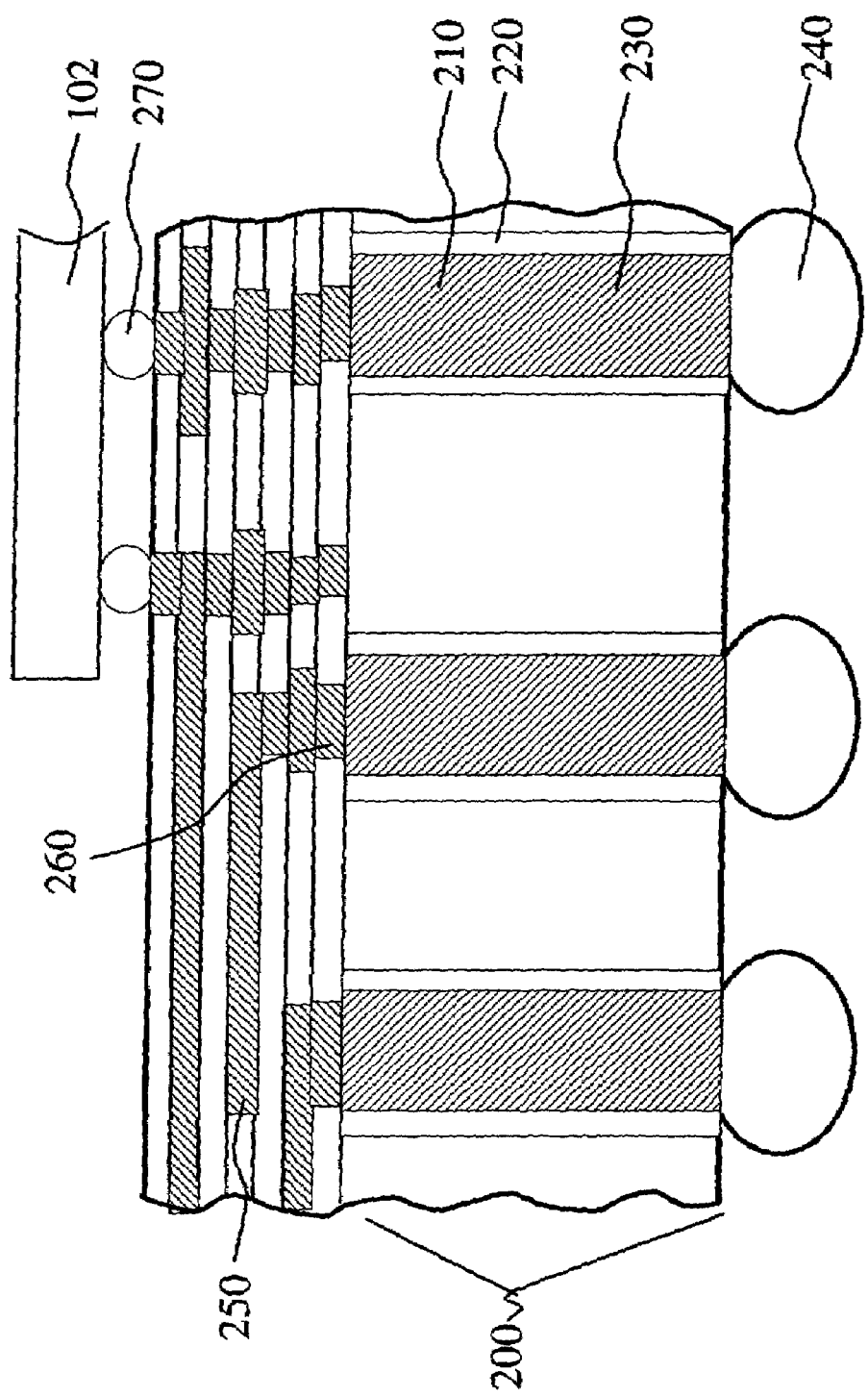
FIG. 2. Schematic representation of the prior art silicon interconnect carrier structure.

The carrier has through silicon vias that allow connection to the second level of packaging that can house many such carriers and other devices and provides power distribution to them. Examples of the methodology for the fabrication of such packaging interface substrate wafers with fully metalized vias through them has been described in, commonly owned, copending application, filed under IBM docket no. YOR920010510US1, filed on Nov. 7, 2002. A schematic representation of this prior art silicon carrier structure, which is just an interconnection substrate between chips, is shown in FIG. 2. It comprises a silicon substrate 200 with through via holes 210 which are passivated by an insulating material 220 and filled with a conductive material 230. A method of manufacturing such vias is described in commonly owned U.S. Pat. No. 6,221,769.

The controlled collapse chip connection (C4) balls 240 made of solder are disposed on the bottom side of these through vias to facilitate connection to the next level of packaging. On the top surface interconnect wires 250 and vias 260 made of conducting materials such as aluminum or copper are disposed and are used to provide communication between integrated circuit chips 102 which are attached to the carrier by means of an array of micro joining pads 270. A high density of input/output (I/O) between the chips and the carrier and high density wiring between the chips is thus facilitated. Conventional processing methods such as lithography, reactive ion etching, deposition of dielectric by spin on coating, plasma enhanced deposition, conductive metal deposition by physical or chemical vapor deposition, electroplating and reactive sintering, planarization by chemical mechanical polishing (CMP) are employed to construct the various features in the carrier.

Figure 3A:
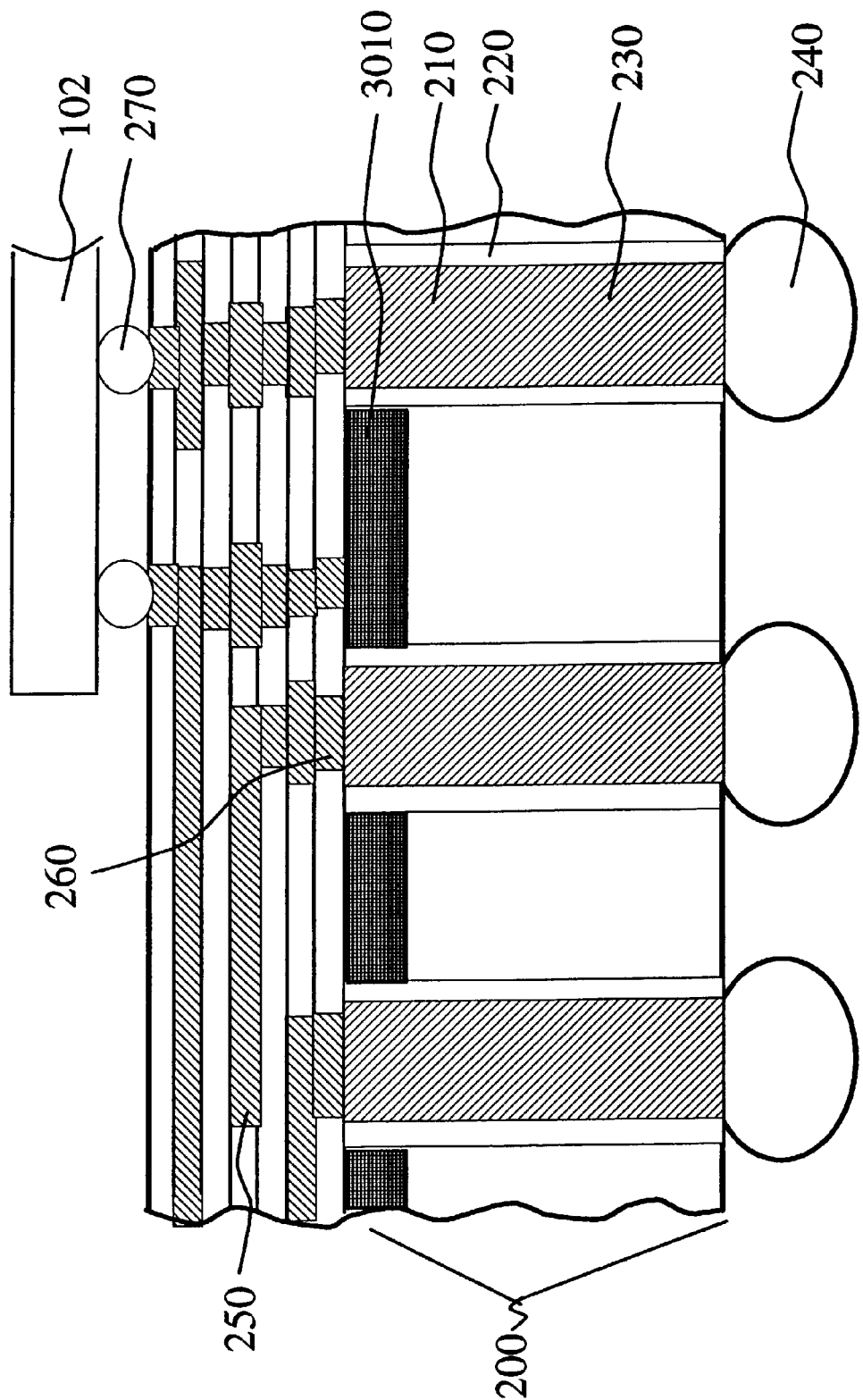
FIG. 3a. Schematic representation of the decoupling capacitor arrays in the form of deep trench capacitors, built on the top surface region of the carrier.

The first embodiment of our inventive design enhances the prior art silicon carrier by adding integrated decoupling capacitors and allowing these passive elements to be accessed by the chips mounted on the carrier through the micro joint I/O connections. The decoupling capacitor arrays in the form of deep trench capacitors are built on the top surface region of the silicon carrier which is not already occupied by the through via features. FIG. 3a shows the schematic representation of such a structure. This embodiment comprises all the prior art features depicted in FIG. 2, but additionally comprises deep trench decoupling capacitor structures 3010 formed adjacent to the silicon through vias 210. State of the art processing used in the fabrication of these deep trenches 3010, such as lithography and reactive ion etching, allows for up to 40:1 aspect ratio, which means that trenches are 40 times as deep as they are wide. The trenches used in the process of this invention have widths between 100 nm and 1000 nm and a depth to width ratio between 2 and 50.

Hence, the use of the trench capacitors is a unique solution allowing for high capacitance value realized by utilizing a small area of the substrate. Another key feature of this embodiment is that the decoupling capacitors are accessible to the circuits on the chips mounted on the carrier within a very short time duration through the microjoint I/O pads. By virtue of the low inductance of the microjoint pads and the fast signal speed enabled by the short interconnect wires on the carrier, the access time can be made much faster in comparison to the time to access other types of off-chip passive elements described earlier. Two possible trench capacitor options are shown in greater detail in FIGS. 3b and 3c.

Figure 3B:
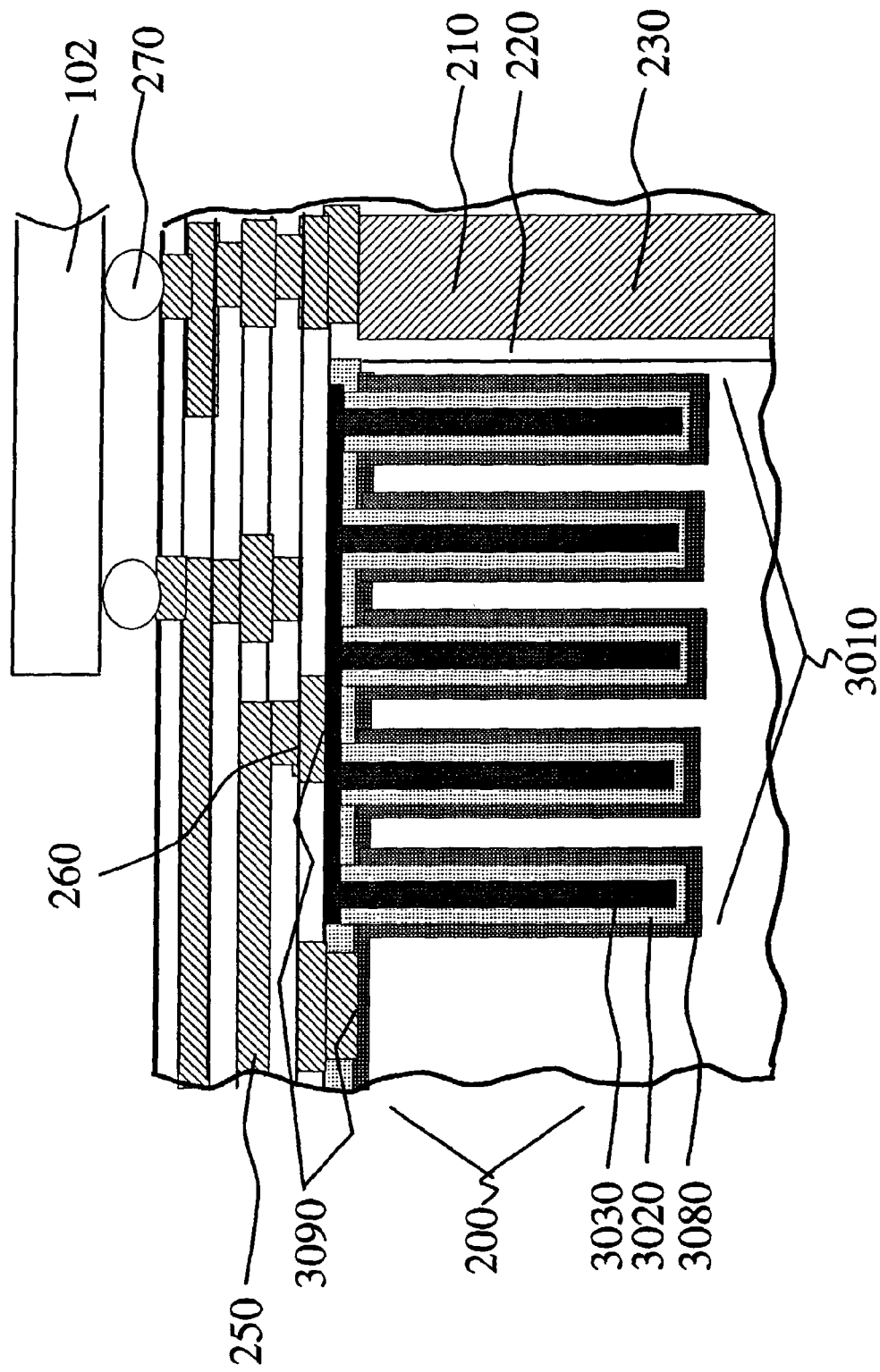
FIG. 3b. Schematic representation of the Metal-Insulator-Metal (MIM) decoupling capacitor arrays in the form of deep trench capacitors, built on the top surface region of the carrier.

The first trench capacitor option designated as metal-insulator-metal or MIM is shown schematically in FIG. 3b. A metal with good conductivity and compatibility with silicon is deposited to line the trench surfaces and the trench tops to form the bottom electrode 3080. Currently, materials such as W, Ti, Ta, Co, their nitrides and silicides, Zr, Hf, SiGe can be deposited in this deep trench structures via atomic layer deposition (ALD) and chemical vapor deposition (CVD). Other conducting materials can also be employed, however the conformality of the film depends on the width and aspect ratio of the trenches. A high k dielectric film 3020, such as silicon nitride, silicon oxinitride, tantalum oxide, titanium oxide, aluminum oxide, zirconium oxide, hafnium oxide, barium strontium titanate, barium zirconium titanate and the like, is then deposited by methods known in the art such as CVD, ALD, anodization and the like. The top conductive electrode 3030 of the trench capacitors is then deposited. Metals such as W, Ta, Ti, Cu, Ni, Pt, Co, Nb, Mo, V, Zr, Pt, Ir, Re, Rh or combinations thereof or their alloys, or just polycrystalline silicon (current state of the art) can be used and can be deposited by ALD, CVD, plating, physical vapor deposition (PVD) or combinations of such methods. The contacts 3090 to layers 3080 (bottom electrode) and 3030 (top electrode) are patterned by lithography and etching to form the finished decoupling structure and provide connections to the through vias 210 or interconnect vias 260 allowing the capacitor array to be wired into the interconnect structure.

Figure 3C:
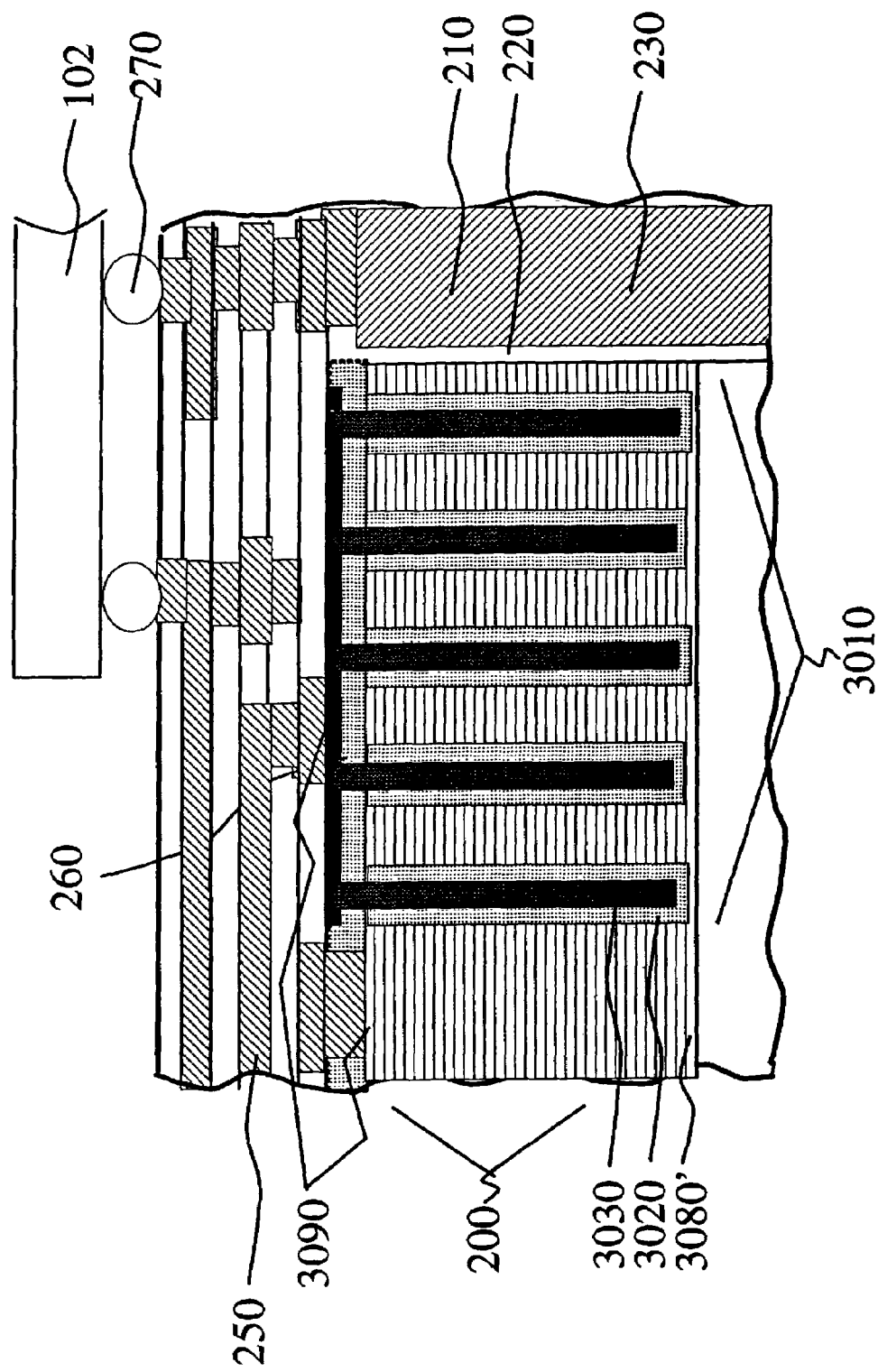
FIG. 3c. Schematic representation of the Metal-Insulator-Silicon (MIS) decoupling capacitor arrays in the form of deep trench capacitors, built on the top surface region of the carrier.

In a second embodiment, the second trench capacitor option designated as metal-insulator-silicon (MIS) depicted schematically in FIG. 3c is used. As in the case of the MIM option of FIG. 3b, the MIS trench capacitors of FIG. 3c are also situated on the top surface of the silicon carrier in the spaces between the through vias. In the MIS option, after the trenches 3010 are formed, an implantation and anneal step is performed to render the trench surfaces and tops highly conductive creating a heavily doped "well" region 3080'. This well 3080' acts as the bottom electrode in this structure. The dopants are implanted with a doping concentration in the range of $10^{-18}$ to $10^{-21}$ atoms/cm$^2$ to achieve low resistivity (<0.01 ohm-cm). The depth of the doping region may vary in the range of 50 nm to 500 nm. Dopants that can be used in forming the bottom conductive layer may be As, P, B and combinations thereof.

The rest of the process flow is identical to the MIM process flow except a compatible metal process must be chosen to contact the doped silicon. The MIS option eliminates the need for a conformal first metal layer and simplifies the process but leads to a slightly lower performance structure since the resistivity of heavily doped silicon 3080' of FIG. 3c is higher than that of metal layer 3080 used in of FIG. 3b. Depending on the application other methods to create a doped Si-based bottom electrode can be implemented, namely, a heavily doped Si wafer can be used as a body of the carrier serving as the bottom electrode at the same time. Other option would be to create a "skin" of the heavily doped Si region around every trench (via implantation and annealing) and if needed a heavily doped "strap" connecting all the deep trenches can be included. Such strap could be formed at some depth below the silicon surface.

The sequence in which the trench capacitors (both from first and second embodiment) and the silicon carrier interconnect features (i.e., through vias, interconnect vias and wires etc.) are made depends on the ease of processing, the thermal budget required for the different steps and the like. In general it is preferred that the trench capacitor formation steps be performed first since they require higher temperatures and special deposition tools (e.g. for high k insulator deposition) that may not be compatible with the conductors employed in the interconnect layers. If lower temperature processes are implemented for creation of the deep trench layers, the process steps may be reversed and through vias can be processed first. A key feature of this disclosure is that the created structure, namely the through via carrier with added functionality, uses a foundry technology (for example a deep trench process used commonly for memory chips) and is based on fairly relaxed ground rules for wire interconnections compared to leading edge CMOS BEOL thus enabling low cost manufacturing.

Figure 4A:
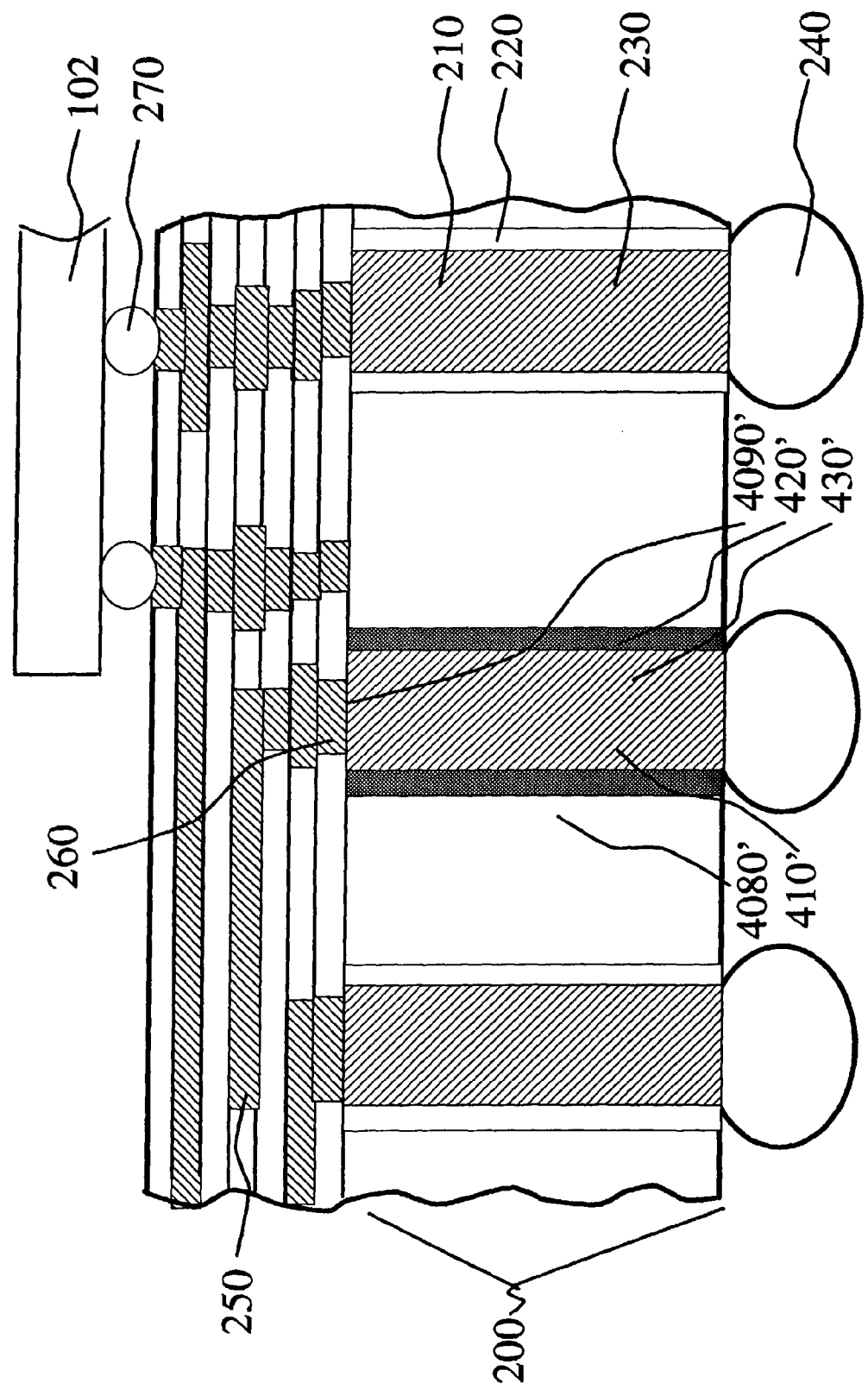
FIG. 4a. Schematic representation of the Metal-Insulator-Silicon (MIS) through via-Based decoupling capacitor built using some of the carrier through vias.
Figure 4B:
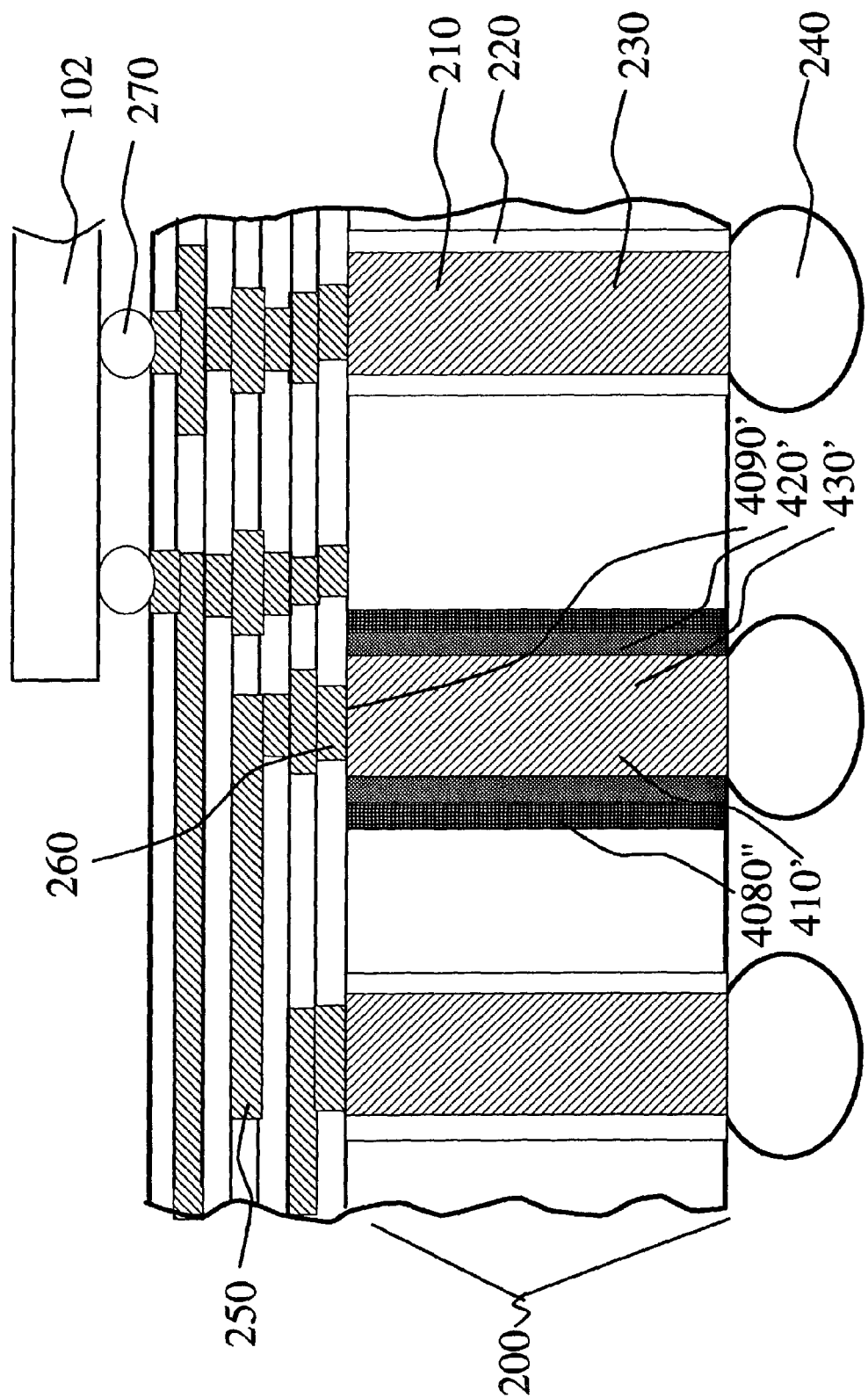
FIG. 4b. Schematic representation of the Metal-Insulator-Metal (MIM) through via-based decoupling capacitor built using some of the carrier through vias.
Figure 4C:
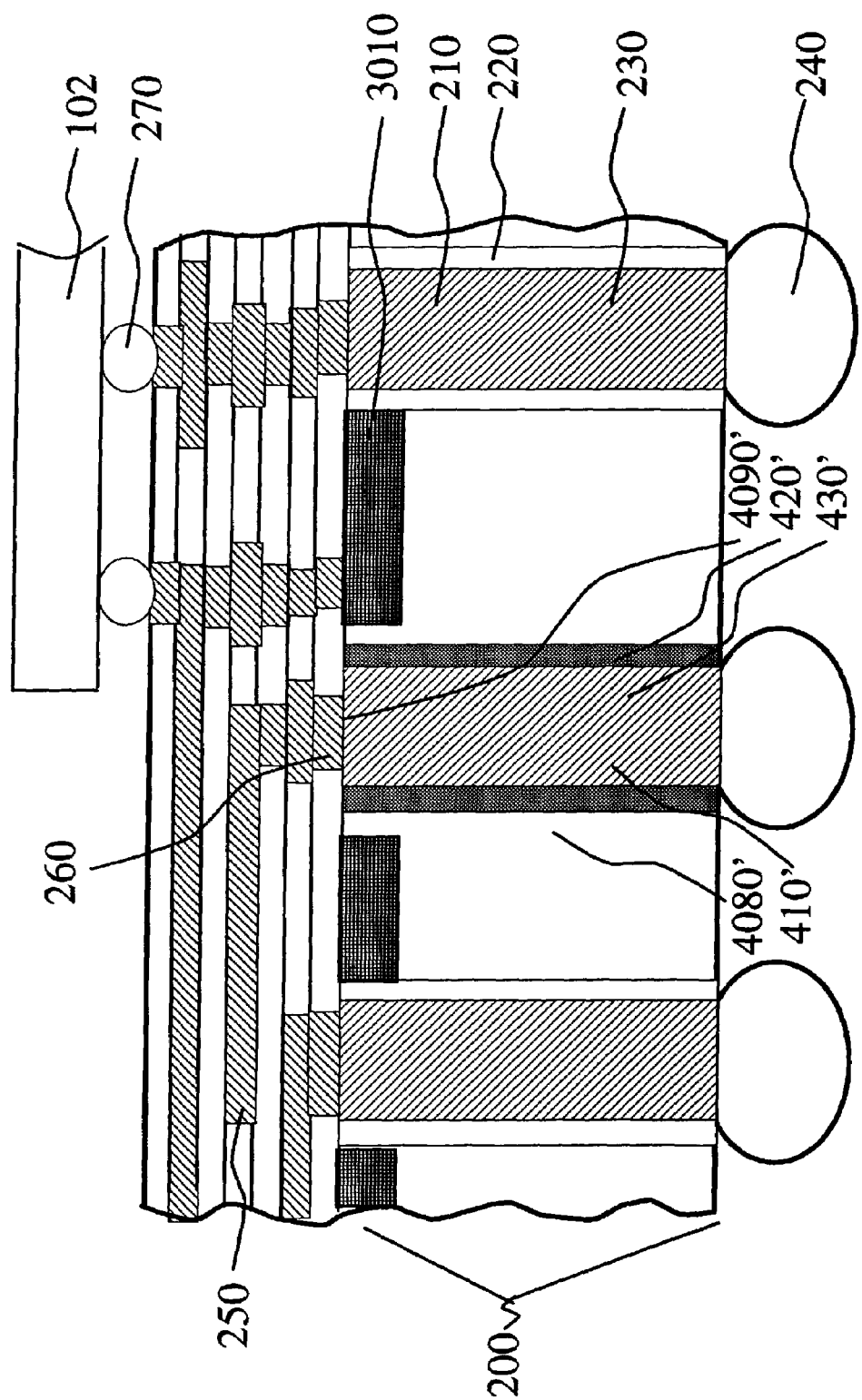
FIG. 4c. Schematic representation of the decoupling capacitor arrays in the form of deep trench capacitors built on the top surface region of the carrier combined with the through via MIS capacitors.
Figure 4D:
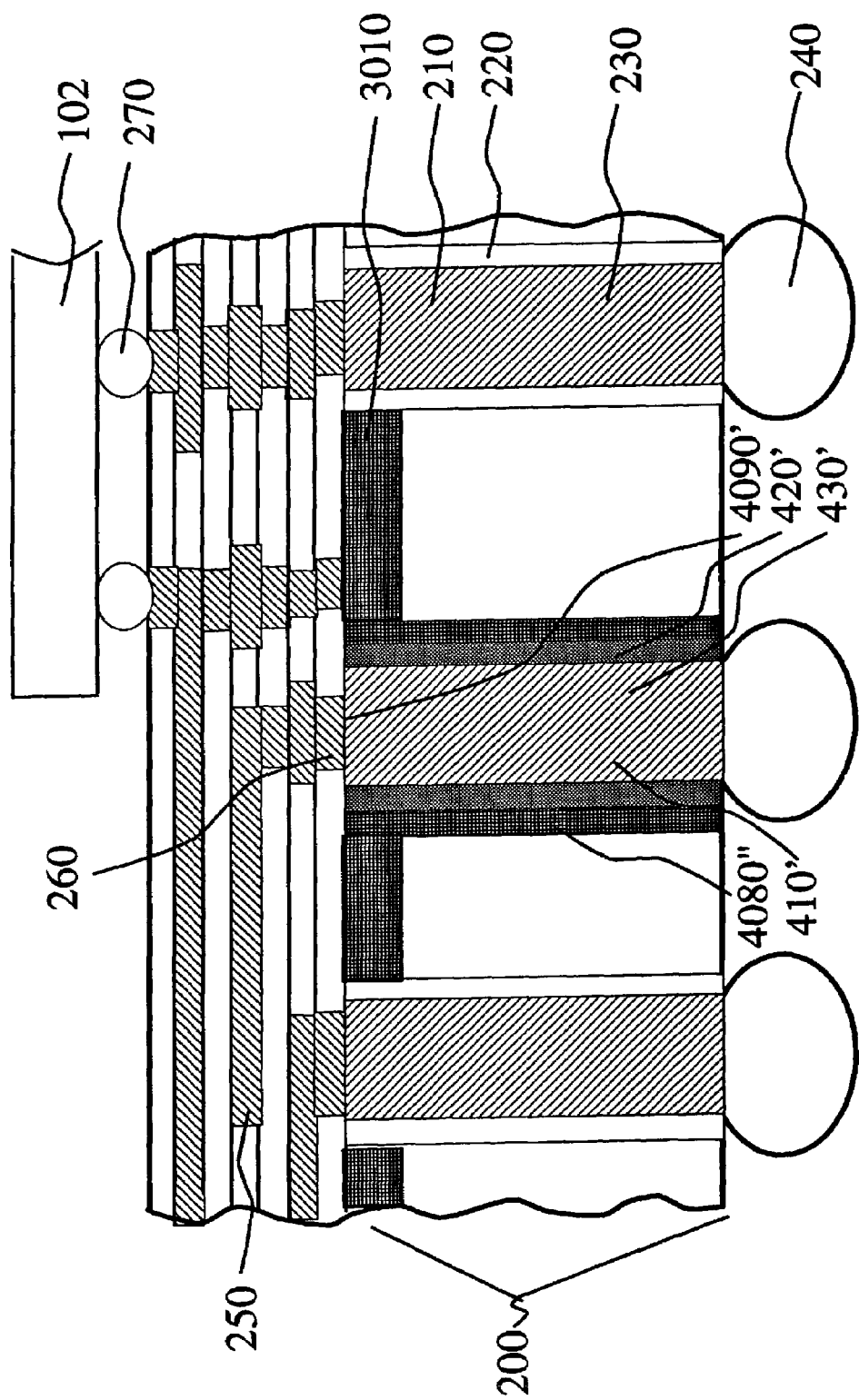
FIG. 4d. Schematic representation OD the decoupling capacitor arrays in the form of deep trench capacitors built on the top surface region of the carrier combined with the through via MIM capacitors.

The third embodiment of this invention is presented in FIG. 4a where the decoupling capacitors are built using the Si-carrier through vias. In this design of the enhanced silicon carrier structure, some of the through vias 410' connected to specific contact locations 4090' in the carrier interconnect wiring are used to construct integrated decoupling capacitors. This is accomplished by providing a coating of a high dielectric constant (k~7 or more) insulator 420' in the interior walls of these vias 410' to be used as the capacitor dielectric, using the conductive filler 430' connected to the contact 4090' as one plate of the capacitor and the heavily doped silicon substrate region 4080' as the other plate forming the integrated capacitor. Of course a possible fourth embodiment depicted in FIG. 4b, comprising through via-based capacitors could implement a metal contact 4080" as a bottom electrode instead of the heavily doped silicon region 4080' of FIG. 4a. These through via-based capacitors shown in FIGS. 4a and 4b can be implemented separately or in addition to the deep trench decoupling capacitors described in the previously mentioned embodiments, see FIGS. 4c and 4d respectively. Hence, the fifth embodiment of this invention adds the deep trench capacitor structures from the first or second embodiment of this invention to the through-via based decoupling capacitor design described in the third or fourth embodiment.

Figure 5A:
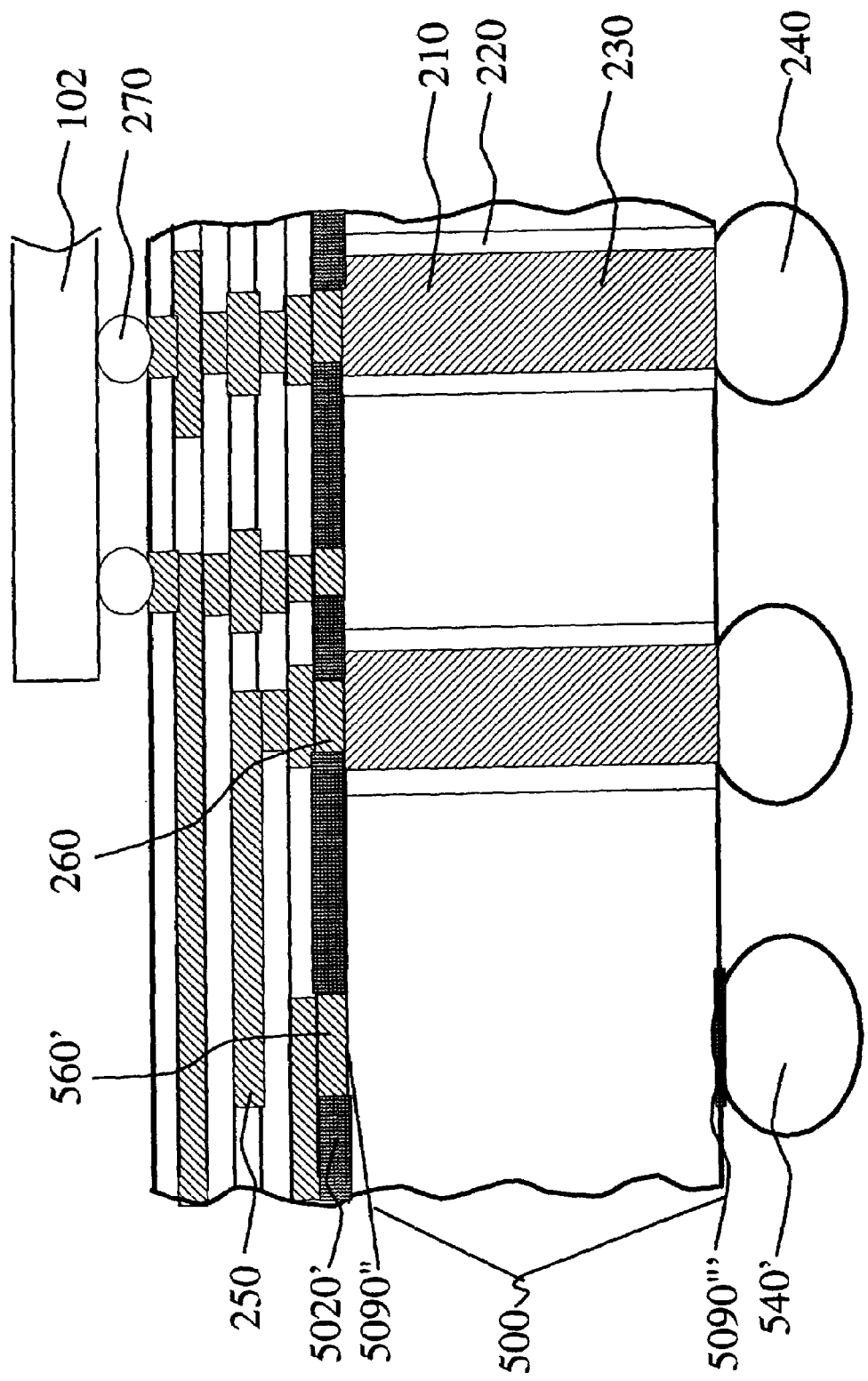
FIG. 5a. Schematic representation of the enhanced carrier structure including integrated resistive elements.
Figure 5B:
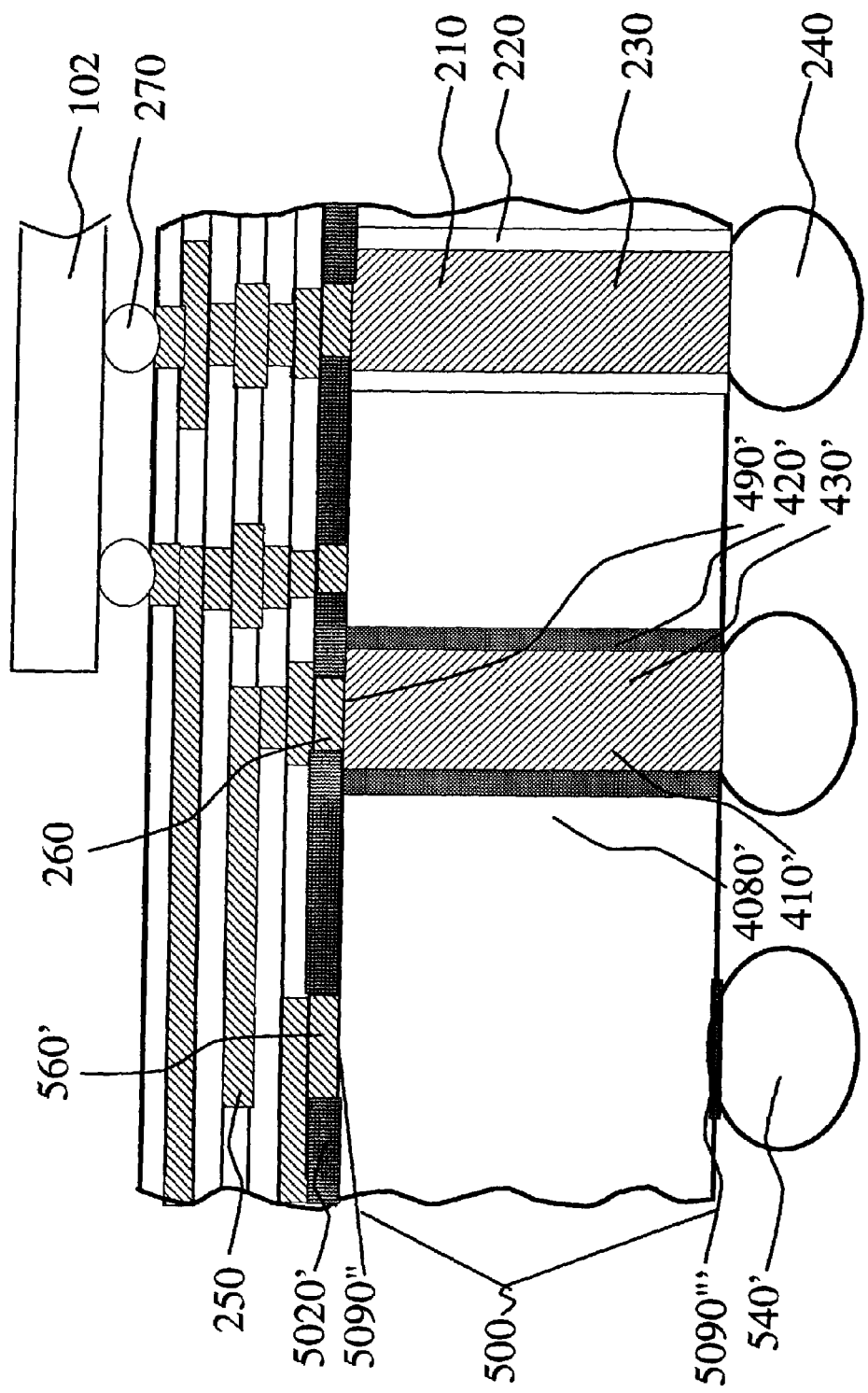
FIG. 5b. Schematic representation of the enhanced carrier structure including integrated passive elements, resistors and through-via capacitors.
Figure 5C:
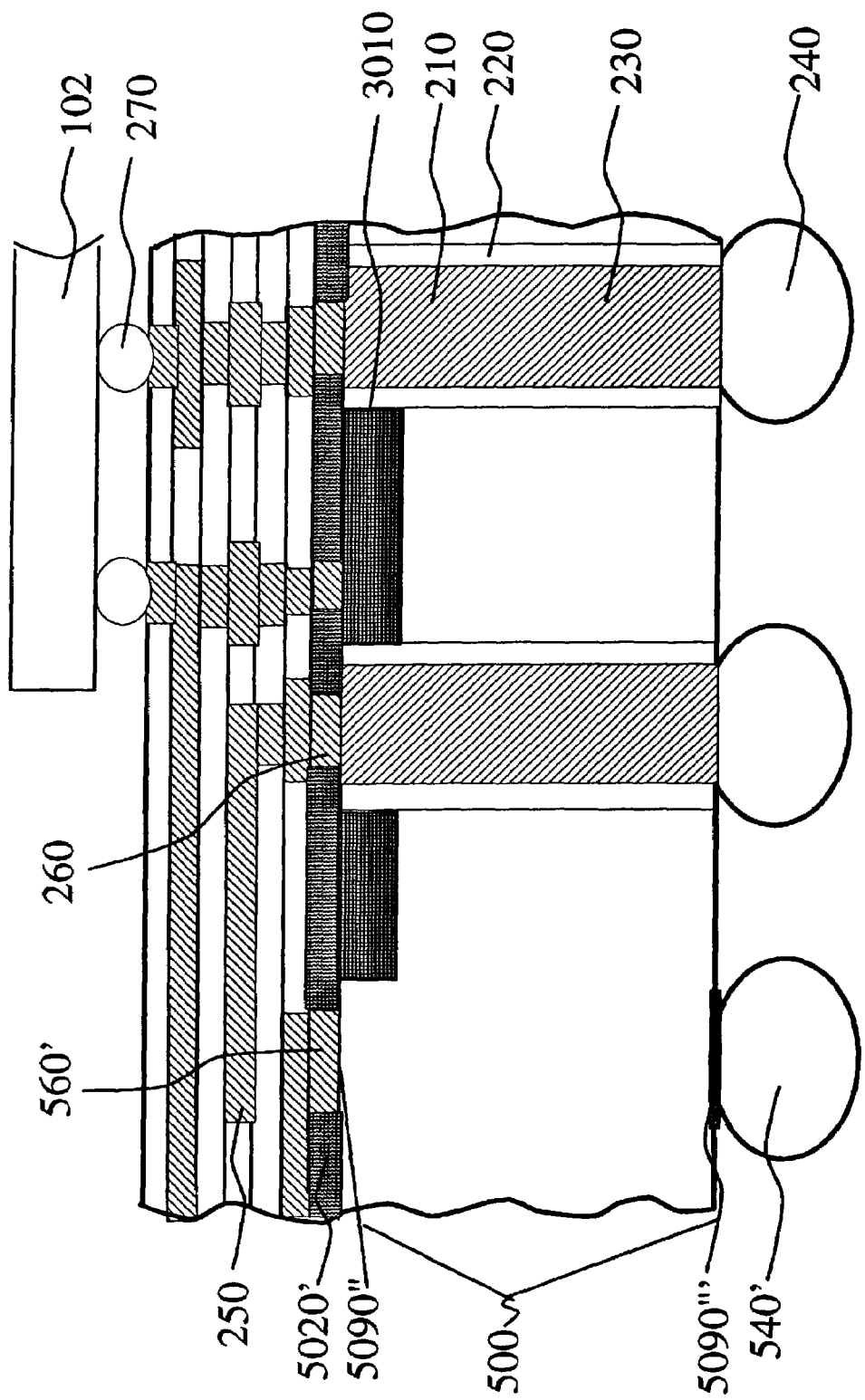
FIG. 5c. Schematic representation of the enhanced carrier structure including integrated passive elements (Resistors and Deep Trench Capacitors)
Figure 5D:
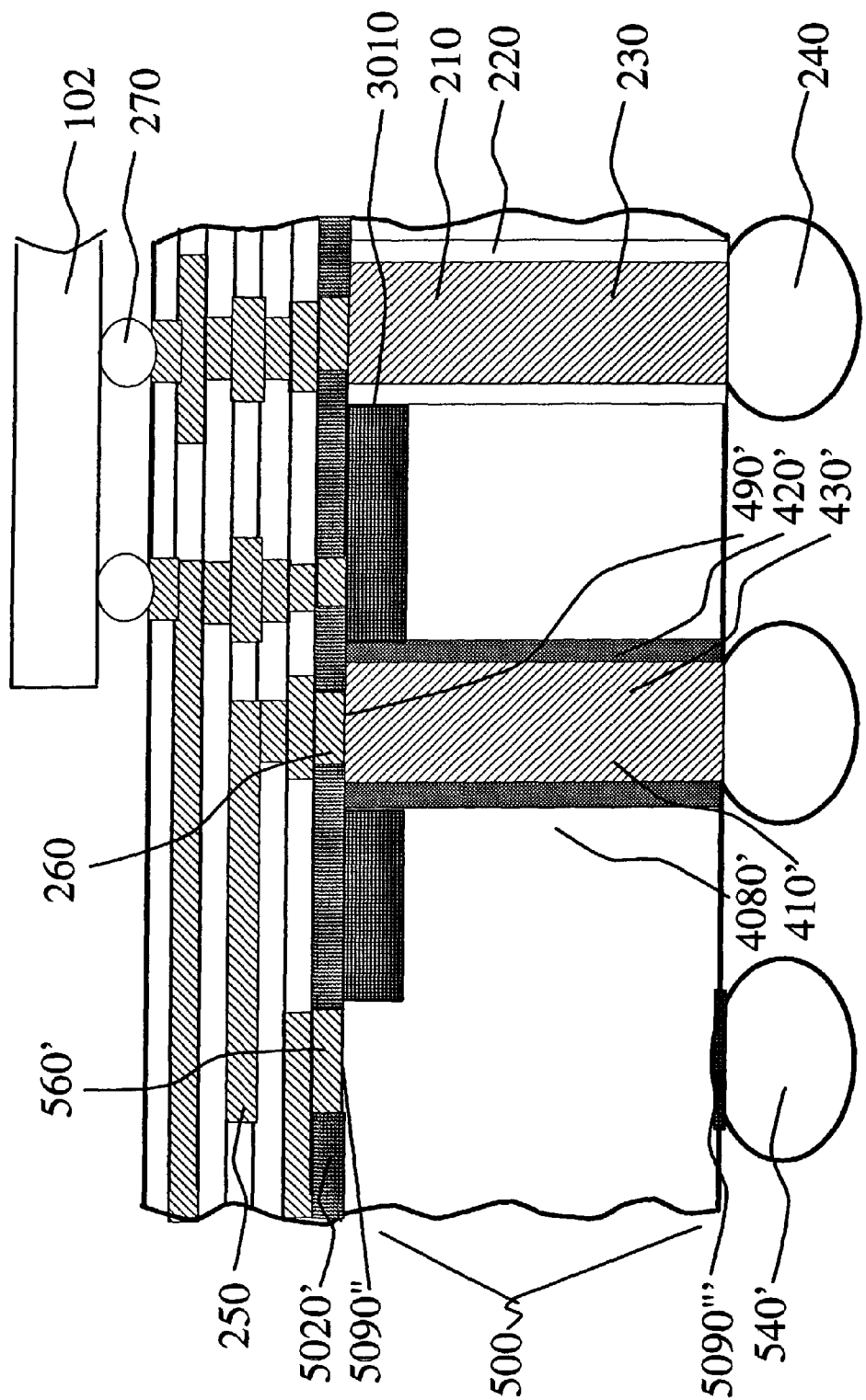
FIG. 5d. Schematic representation of the enhanced carrier structure including integrated passive elements (Resistors, Deep Trench and Through-via Capacitors)

FIG. 5a depicts a schematic representation of the enhanced silicon carrier structure, including resistive elements, which represents the sixth embodiment of this inventive design. The purpose of the integrated resistor element is to damp the voltage fluctuations associated with the ΔI noise. Usually, when discretely localized resistors are used in circuits to provide damping of voltage fluctuations, a concern about power dissipation is raised. The present invention eliminates the issues related to localized resistors and their localized heating and power dissipation by using the whole carrier (doped silicon substrate) as a resistive element. More specifically in this embodiment the silicon substrate 200 of the prior art carrier (FIG. 2) is replaced by a specially doped silicon substrate 500 so that it has a resistivity appropriate to form the resistive elements between the different voltage reference levels in the chips employed. The top surface of the wafer 500 is coated with an insulator 5020' and openings are made to form contacts 5090" between the resistive silicon substrate and specific interconnect vias 560'. Similarly the contact 5090''' between the Si substrate and the specific C4 solder balls 540' is created allowing connection to the voltage reference planes in the next level of package (not shown). The portion of the silicon wafer between specific C4 balls 540' and the corresponding top contact 5090" forms the integrated resistor element. As shown in FIG. 5b, this resistive element can be incorporated in the silicon carrier with capacitive elements based on a through via design, or based on a deep trench design as shown in FIG. 5c, or a combination of both capacitive elements as depicted in FIG. 5d. (The details of these capacitive structures are the same as previously described in the first through the fourth embodiments of this invention). The voltage drop observed due to the incorporation of the resistive element, can be compensated by increase in the power supply voltage value to maintain the proper operation of the circuits in the chip.

Other variations are possible in the resistive element construction. The Si carrier region between C4 contact 5090''' and interconnecting via contact 5090'' can have a graded resistivity profile (different doping levels through the thickness of the carrier) with the highest resistivity closer to the C4 connections. For this type of structural geometry, this solution results in the incorporation of high resistivity components (~0.2 ohm-cm) in series with power supply and lower resistance components (0.1–0.01 mohm) in series with capacitor. For example an epi-Si layer (1–5 μm) can be incorporated in the design. The selected configuration needs to satisfy the requirement of good ohmic contact of the lower-doped region to the metal. Terminating resistors made from resistive films such as tantalum nitride, tantalum, Ni—Cr alloys, Cr—$SiO_2$ composites and the like can also be integrated into the wiring scheme may also be optionally implemented to enable finer control of the total resistance value desired.

The characteristics of the resistive element R are a function of the electrical property of the substrate used. As mentioned before, the desired resistance value can be achieved by appropriate choice of substrate (graded implant and resistance profile, separate thin film termination resistors). On the other hand the performance of the capacitive element C is dependent on the geometry chosen (through via walls or trench array) and the materials used to form the bottom electrode (highly doped silicon body of the carrier, metal or metal silicide layer), dielectric thin film layer (silicon nitride or a higher-k material), and top metal electrode (metal filled via connected to the surface pad).

Adequate capacitance combined with low resistance (by use of metal and highly doped electrodes) results in an acceptably low RC delay constant which in turn enables faster access time. Also, since the capacitive and resistive elements are integrated on the carrier and are accessed through the high performance interconnect wires 250 and vias 260 and 560', and microjoints 270 with low inductance, the access time is much smaller than the case where discrete capacitors mounted on the module or board are used.

By appropriately tailoring the values of the resistor Rc, and the decoupling capacitor Cc (FIG. 1) one can reduce the voltage fluctuations (swings) associated with ΔI surges associated with switching events. Further, reduced path lengths and faster signal speeds in the interconnect lines between active devices on the chip (minimized Lp and Rp values) and optimized use of the passive components (Cc and Rc) on the carrier allow optimized electrical performance. The Rc resistance of 1.5 mohm with passive capacitance Cc values better than 1 μF/$cm^2$ support the circuit response time in the 100 picosecond range yielding a decrease in the noise level by 33%.

As previously indicated, an important aspect of the present inventive structure is that an increased functionality of a high density chip carrier is achieved by building passives and sharing the carrier surface area for interconnect, I/O and decoupling functions. This alleviates the need to use valuable space on the chips to provide passives and thus the chip real estate can be utilized for active devices. Alternately, for a given number of active devices per chip, the chip size can be reduced thereby enabling higher yield of chips per wafer and a lower cost per chip. A simple integration scheme can be utilized to incorporate passive components (the area of the resistors, capacitors, ground and signal lines all defined in one patterning and etching process followed by via-fill and wiring level buildup) and the interconnect wires on the carrier using CMOS compatible processing schemes with high cost efficiency. The resulting carrier is therefore a highly value added component which can enable the integration of complex high performance systems by mounting several optimized chips with unique functions on a single silicon carrier. However, the added functionality does not have to be limited to passive components only. Other optical and electrical circuit elements can be formed on the surface of the carrier improving its functionality (both top and the bottom surface of the carrier).

Figure 6:
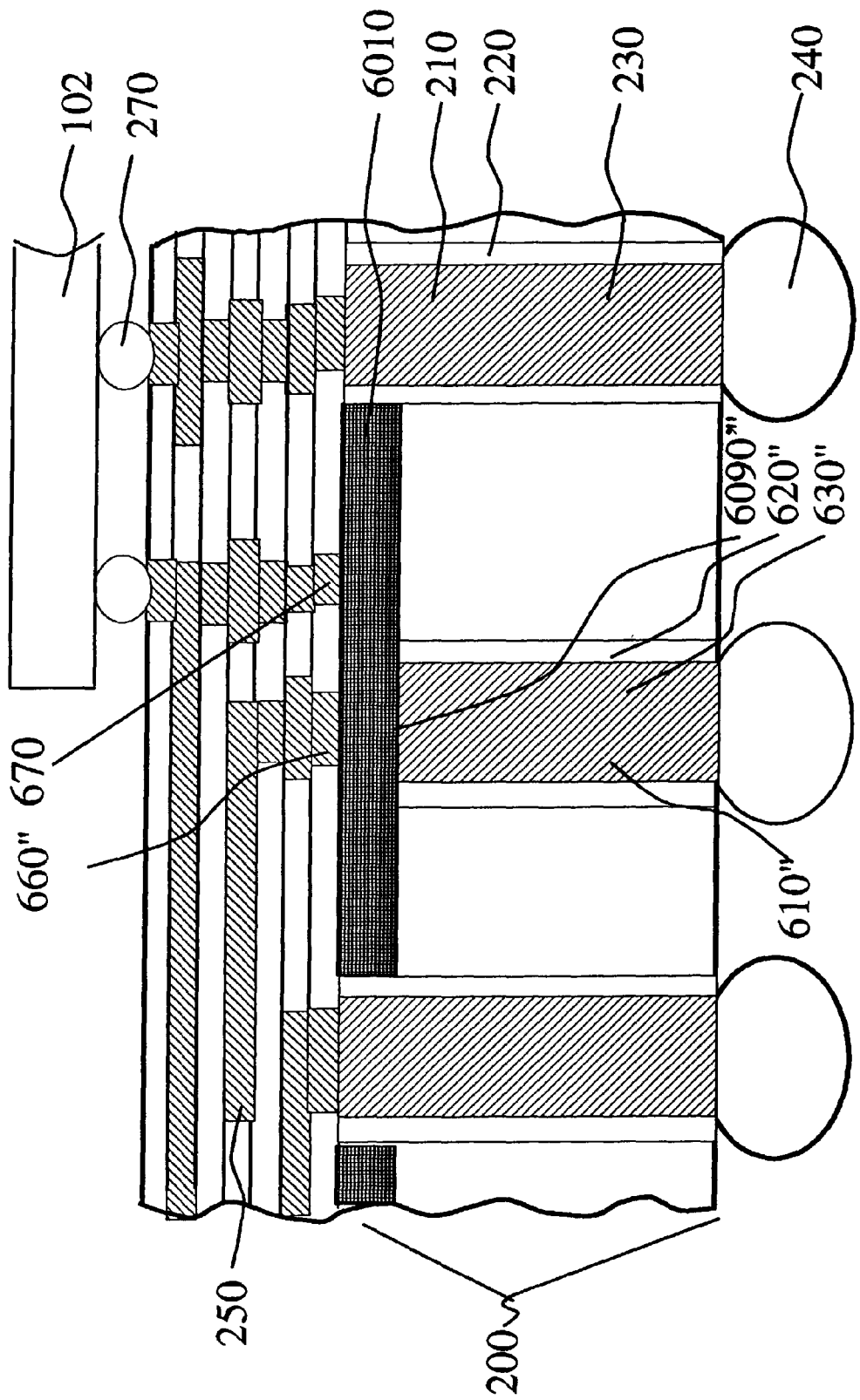
FIG. 6. Schematic representation of the functional element (optical or electrical component) built on the top surface region of the carrier, with a bottom electrode contact created by through via technology (from the bottom of the carrier).

To allow faster access time from the package to the elements added on the carrier, and to more efficiently use the carrier through vias, the bottom surface of the bottom electrode of these elements could be directly connected to vias in the carrier placed below these elements. This connection will be in addition to the connections to the pads on the top surface of the carrier. The schematic representation of this embodiment is presented in FIG. 6. The top electrode of the added elements 6010 connects to the interconnecting via 660'' and the top surface of the bottom electrode connects to interconnecting via 670; in addition, the contact to the bottom electrode 6090''' is also provided by connecting to a via 610'' from the bottom of the carrier. Via 610 has a dielectric layer 620'' and conductive layer 630''. Depending on the choice of the conductive material used for the bottom electrode 6090''' of the elements in the carrier, the via 610'' will be in contact with either the doped silicon region (second embodiment of this invention) or other conductive material (first embodiment of this invention). Access to the elements on the carrier from the chip side will be by means of the vias 660'' and 670 to keep the path lengths and inductance low. This option of connecting to the bottom electrode of the functional element directly to the bottom surface of the carrier will become more important as the thickness of the carrier reaches smaller values, namely as the length of the connection to the bottom electrode of the element from the bottom surface of the carrier becomes a bigger fraction of the total length of the carrier through vias.

The examples and embodiments provided above are illustrative and other variations of this inventive structure are possible for those familiar with the art in the field of microelectronics. The carrier of this invention could be adapted to support other types of semiconductor components. Additionally, the chip carrier can be utilized to form memory arrays, which are very similar in structure and processing steps to the trench capacitor arrays. These memory arrays can share the carrier real estate between the through vias with the decoupling elements. Such memory arrays will be accessible within a shorter time compared to package mounted memory blocks and thus allow improved system level performance. Since the carrier interconnects and the microjoint I/Os are capable of supporting high signal speed, it is possible to use these memory banks in place of some of the on chip embedded memory. This again affords better use of the chip real estate for computational logic devices or reducing the chip size for a given logic device count. By selectively placing memory blocks on the carrier just below where the chips are mounted, they can be made available at very fast access times to the logic devices in the chips for storage and retrieval operations. This in turn will improve the performance at the multichip system level.

This invention is based on the use of the silicon-based carrier. This type of material was proposed since it is compatible with current CMOS technology. In addition, a variety of specialized methods have been developed for silicon processing, for example ability to pattern vias several hundred microns deep with high packing density giving the Si technology advantage over currently used ceramic packaging technology. However the focus of this invention is on added functionality of the carrier. The concepts taught in the present invention can be used to add functionality in other carriers without deviating from the spirit of the invention. For example, the methods can be applied to future optoelectronic device structures. In such cases, firstly the type of the material used to create the carrier can be replaced by other materials such as sapphire, quartz, gallium arsenide, indium phosphide and organic materials, and should be selected according to the specific application. Secondly the functional carrier can be an integral part of an optoelectronic structure, including future 3-dimensional circuit stacks, allowing for integration of complex multifunctional and mixed-technology systems or elements on a single carrier.

We claim:

1. An integrally formed semiconductor carrier structure for interconnecting semiconductor components comprising:
   a semiconductor substrate layer having at least one via constructed therein;
   a first interface layer deposited on said substrate having a connection to at least one semiconductor component;
   a second interface layer deposited on said substrate having a connection to a level of packaging formed through said at least one via;
   at least one passive component deposited on said substrate layer; and
   a set of conductive components, formed on said substrate, and associated with said first and/or second interface layers to connect said at least one passive component to said semiconductor components and/or said level of packaging.

2. A carrier for interconnecting semiconductor components, according to claim 1, wherein said set of conductive components includes one or more contact pads, interconnect vias, and/or interconnect wires which connect said at least one passive component to said semiconductor components and said other level packaging in a close electrical proximity connection a fast response time.

3. A carrier for interconnecting semiconductor components, according to claim 1, wherein said at least one via is coated with a low dielectric constant insulator and filled with a conductive material to form conductive elements.

4. A carrier for interconnecting semiconductor components, according to claim 3, wherein said low dielectric constant insulator is a material selected from the group comprising silicon oxide, amorphous hydrogenated silicon nitride, silicon carbide, amorphous films containing Si, C, O, and H and combinations thereof.

5. A carrier for interconnecting semiconductor components, according to claim 1, wherein said substrate is made of silicon.

6. A carrier for interconnecting semiconductor components, according to claim 1, wherein said semiconductor chip is connected to said first interface by microjoint input/output contacts.

7. A carrier for interconnecting semiconductor components, according to claim 1, wherein said second interface is connected to said level of packaging by controlled collapse chip connection balls.

8. A carrier for interconnecting semiconductor components, according to claim 1, wherein said at least one passive component comprises a decoupling capacitor.

9. A carrier for interconnecting semiconductor components, according to claim 8, wherein said at least one decoupling capacitor comprises multiple trench capacitors.

10. A carrier for interconnecting semiconductor components, according to claim 9, wherein said trench capacitors comprise:
    an array of trenches extending into the substrate from a surface thereof; and
    said trenches lined with a first conductive material, a high dielectric constant insulator, and a second conductive material to font a trench capacitor.

11. A carrier for interconnecting semiconductor components, according to claim 10, wherein said trenches have widths between 100 nm and 1000 nm and a depth to width ratio between 2 and 50.

12. A carrier for interconnecting semiconductor components, according to claim 10, wherein said first conductive material is selected from the group comprising W, Ti, Ta, Co, Zr, Hf, their conducting nitrides, their suicides and their conducting siliconitrides and combinations thereof; Cu, Ni, Pt, Zr; Nb, Mo, V, Ir, Re, Rt, and combination thereof.

13. A carrier for interconnecting semiconductor components, according to claim 10, wherein said high dielectric constant insulator is selected from the group consisting of silicon nitride, silicon oxynitride, aluminum oxide, aluminum nitride, zirconium oxide, hafnium oxide, tantalum oxide, barium strontium titanate, barium zirconium titanate and combinations thereof.

14. A carrier for interconnecting semiconductor components, according to claim 9, wherein said second conductive material is selected from the group comprising W, Ti, Ta, Co, Zr, Hf, their conducting nitrides, their silicides and their conducting siliconitrides; Cu, Ni, Pt, Zr; Nb, Mo, V, Ir, Re, Rt, and combinations thereof; and poly crystalline silicon.

15. A carrier for interconnecting semiconductor components, according to claim 9, wherein said deep trench capacitor comprises a metal-insulator-metal trench capacitor.

16. A carrier for interconnecting semiconductor components, according to claim 9, wherein said trench capacitor comprises a metal-insulator-silicon trench capacitor.

17. A carrier for interconnecting semiconductor components, according to claim 15, wherein said metal-insulator-metal trench capacitor comprises:
    an array of trenches extending into the substrate;
    a bottom conductive layer formed by depositing a metal coating to the trench surfaces; and
    said metal coated trenches lined with a high dielectric constant insulator, and a third conductive material to form a trench capacitor.

18. A carrier for interconnecting semiconductor components, according to claim 16, wherein said metal-insulator-silicon trench capacitor comprises:
    an array of trenches extending into the substrate;
    a bottom conductive layer formed by doping said substrate; and
    said doped trenches lined with a high dielectric constant insulator, and a third conductive material to form a trench capacitor.

19. A carrier for interconnecting semiconductor components, according to claim 8, wherein said decoupling capacitor is a via-based capacitor further comprising:
    a bottom conductive layer formed by depositing a metal coating to the interior walls of a via;
    a coating of a high dielectric constant insulator forming a lining on said metal coated walls of said via;
    a conductive filler in the interior of said via; and wherein said decoupling capacitor is formed with said dielectric lining acting as the capacitor dielectric, said interior conductive filler acting as one plate and said metal coating acting as another plate.

20. A carrier for interconnecting semiconductor components, according to claim 8, wherein said decoupling capacitor is a via-based capacitor further comprising:
   a coating of a high dielectric constant insulator on the interior walls of a via;
   a conductive filler in the interior of said via;
   a heavily doped region of said substrate layer adjacent said via; and
   wherein said decoupling capacitor is formed with said dielectric coating acting as the capacitor dielectric, said interior conductive tiller acting as one plate and said heavily doped region of said substrate acting as another plate.

21. A carrier for interconnecting semiconductor components, according to claim 9, further comprising at least one via-based capacitor comprising:
   a coating of a high dielectric constant insulator on the interior walls of a via;
   a conductive filler in the interior of said via;
   a heavily doped region of said substrate layer adjacent said via; and
   wherein said decoupling capacitor is formed with said dielectric coating acting as the capacitor dielectric, said interior conductive filler acting as one plate and said heavily doped region of said substrate acting as another plate.

22. A carrier for interconnecting semiconductor components, according to claim 1, wherein said at least one passive component comprises a resistive element further comprising:
   a doped substrate layer having a resistivity for the purpose of damping voltage fluctuation due to noise;
   an insulating coating separating said substrate layer from said first interface;
   a via constructed in said insulating coating to provide a conduction path to said connection of said first interface;
   an insulating pad separating said substrate from said second interface, said insulating pad having a conducting path constructed therein to connect said substrate to said connection at said second interface.

23. A carrier for interconnecting semiconductor components, according to claim 9, further comprising:
   a resistive element comprising:
   a doped substrate layer having a resistivity for the purpose of damping voltage fluctuation due to noise;
   an insulating coating separating said substrate layer from said first interface;
   a via constructed in said insulating coating to provide a conduction path to said connection of said first interface;
   an insulating pad separating said substrate from said second interface, said insulating pad having a conducting path constructed therein to connect said substrate to said connection at said second interface.

24. A carrier for interconnecting semiconductor components, according to claim 22, wherein said resistive element is constructed with a graded resistivity.

25. A carrier for interconnecting semiconductor components, according to claim 24, wherein said graded resistivity is higher towards said second interface.

26. A carrier for interconnecting semiconductor components, according to claim 8, further comprising a resistive element comprising:
   a silicon doped substrate layer having a resistivity for the purpose of damping voltage fluctuation due to noise;
   an insulating coating separating said substrate layer from said first interface;
   a via constructed in said insulating coating to provide a conduction path to said connection of said first interface;
   an insulating pad separating said substrate from said second interface, said insulating pad having a conducting path constructed therein to connect said substrate to said connection at said second interface.

27. A carrier for interconnecting semiconductor components, according to claim 21, further comprising a resistive element comprising:
   a silicon doped substrate layer having a resistivity for the purpose of damping voltage fluctuation due to noise;
   an insulating coating separating said substrate layer from said first interface;
   a via constructed in said insulating coating to provide a conduction path to said connection of said first interface;
   an insulating pad separating said substrate from said second interface, said insulating pad having a conducting path constructed therein to connect said substrate to said connection at said second interface.

28. An integrally formed semiconductor carrier for interconnecting semiconductor components comprising:
   a semiconductor substrate layer having at least one via constructed therein;
   a first interface layer deposited on said substrate having a connection to at least one semiconductor component;
   a second interface deposited on said substrate having a connection to a level of packaging formed through said at least on via;
   an array of trenches extending into said substrate layer from a surface thereof and adapted to function as components; and
   a set of conductive components associated with said first interface to interconnect said trench components and to connect said trench components to said semiconductor components.

29. A carrier for interconnecting semiconductor components, according to claim 28, wherein said set of conductive components includes one or more contact pads, interconnect vias, and/or interconnect wires.

30. A carrier for interconnecting semiconductor components, according to claim 28, wherein said substrate is made of silicon.

31. A carrier for interconnecting semiconductor components, according to claim 28, wherein said semiconductor component is connected to said first interface by microjoint input/output contacts.

32. A carrier for interconnecting semiconductor components, according to claim 28, wherein said second interface is connected to another layer of packaging by controlled collapse chip connection balls.

33. A carrier for interconnecting semiconductor components, according to claim 28 further comprising at least one secondary via connected to said array of trenches to allow the connection of said trench components directly to said level of packaging.

34. A carrier for interconnecting semiconductor components, according to claim 28, wherein said array of trenches is lined with a first conductive material, a high dielectric constant insulator, and a second conductive material to form a deep trench capacitor.

35. A carrier for interconnecting semiconductor components, according to claim 28, wherein said trenches have widths between 100 nm and 1000 nm and a depth to width ratio between 2 and 50.

36. A carrier for interconnecting semiconductor components, according to claim 34, wherein said first conductive material is selected from the group comprising W, Ti, Ta, Co, Zr, Hf, their conducting nitrides, their silicides and their conducting siliconitrides and combinations thereof; Cu, Ni, Pt, Zr; Nb, Mo, V, Ir, Re, Rt, and combination thereof.

37. A carrier for interconnecting semiconductor components, according to claim 34, wherein said high dielectric constant insulator is selected from the group consisting of silicon nitride, silicon oxynitride, aluminum oxide, aluminum nitride, zirconium oxide, hafnium oxide, tantalum oxide, barium strontium titanate, barium zirconium titanate and combinations thereof.

38. A carrier for interconnecting semiconductor components, according to claim 34, wherein said second conductive material is selected from the group comprising W, Ti, Ta, Co, Zr, Hf, their conducting nitrides, their silicides and their conducting siliconitrides; Cu, Ni, Pt, Zr; Nb, Mo, V, Zr, Re, Rt, and combinations thereof; and poly crystalline silicon.

39. A carrier for interconnecting semiconductor components, according to claim 34, wherein said deep trench capacitor comprises a metal-insulator-metal trench capacitor.

40. A carrier for interconnecting semiconductor components, according to claim 39, wherein said metal-insulator-metal trench capacitor comprises:
an array of trenches extending into the substrate;
a bottom conductive layer formed by depositing a metal coating to the trench surfaces; and
said metal coated trenches lined with a high dielectric constant insulator, and a second conductive material to form a trench capacitor.

41. A carrier for interconnecting semiconductor components, according to claim 34, wherein said trench capacitor comprises a metal-insulator-silicon trench capacitor.

42. A carrier for interconnecting semiconductor components, according to claim 41, wherein said metal-insulator-silicon deep trench capacitor comprises:
an array of trenches extending into the substrate;
a bottom conductive layer formed by doping said substrate at the surface of said trenches and a small depth below the surface of said trenches with dopants; and
said doped trenches lined with a high dielectric constant insulator, and a second conductive material to form a trench capacitor.

43. A carrier for interconnecting semiconductor components, according to claim 28, further comprising at least one via-based capacitor comprising:
a coating of a high dielectric constant insulator on the interior walls of a via;
a conductive filler in the interior of said via;
a heavily doped region of said substrate layer adjacent said via; and
wherein said decoupling capacitor is formed with said dielectric coating acting as the capacitor dielectric, said interior conductive filler acting as one plate and said heavily doped region of said substrate acting as another plate.

44. A carrier for interconnecting semiconductor components, according to claim 28, further comprising:
a resistive element comprising:
a silicon doped substrate layer having a resistivity for the purpose of damping voltage fluctuation due to noise;
an insulating coating separating said substrate layer from said first interface;
a via constructed in said insulating coating to provide a conduction path to said connection of said first interface;
an insulating pad separating said substrate from said second interface, said insulating pad having a conducting path constructed therein to connect said substrate to said connection at said second interface.

45. A carrier for interconnecting semiconductor components, according to claim 44, wherein said resistive element is constructed with a graded resistivity.

46. A carrier for interconnecting semiconductor components, according to claim 45, wherein said graded resistivity is higher towards said second interface.

47. A carrier for interconnecting semiconductor components, according to claim 43, further comprising a resistive element comprising:
a silicon doped substrate layer having a resistivity for the purpose of damping voltage fluctuation due to noise;
an insulating coating separating said substrate layer from said first interface;
a via constructed in said insulating coating to provide a conduction path to said connection of said first interface;
an insulating pad separating said substrate from said second interface, said insulating pad having a conducting path constructed therein to connect said substrate to said connection at said second interface.

48. A carrier for interconnecting semiconductor components comprising:
a semiconductor substrate layer having at least one via constructed therein;
a first interface deposited on said substrate having a connection to at least one semiconductor component;
a second interface deposited on said substrate having a connection to a level of packaging;
at least one memory cell formed in said substrate layer; and
a set of conductive components associated with said first interface to connect said memory cell to said semiconductor components.

49. A carrier for interconnecting semiconductor components, according to claim 48 further comprising at least one secondary via connected to said at least one memory cell to allow the connection of said at least one memory cell directly to said level of packaging.

50. A carrier far interconnecting semiconductor components comprising:
a semiconductor substrate layer having at least one via constructed therein;
a first interface layer deposited on said substrate having a connection to at least one semiconductor component;
a second interface layer deposited on said substrate having a connection to a level of packaging;
at least one optoelectronic structure in said substrate layer; and
a set of conductive components associated with said first interface to connect said optoelectronic structure to said semiconductor components.

51. A carrier for interconnecting semiconductor components, according to claim 50 further comprising at least one secondary via connected to said at least one optoelectronic to allow the connection of said at least one optoelectronic structure directly to said other level of packaging.

52. A carrier for interconnecting semiconductor components, according to claim 50, wherein said substrate is made of a material selected from the group including: sapphire, quartz, gallium arsenide, indium phosphide and organic materials.

* * * * *